US011459672B2

(12) United States Patent
Park et al.

(10) Patent No.: US 11,459,672 B2
(45) Date of Patent: Oct. 4, 2022

(54) METHOD FOR MANUFACTURING STRUCTURE

(71) Applicants: LG CHEM, LTD., Seoul (KR); KOREA ADVANCED INSTITUTE OF SCIENCE AND TECHNOLOGY, Daejeon (KR)

(72) Inventors: Eunkyung Park, Daejeon (KR); Jang Wook Choi, Daejeon (KR); Sung Hyeon Park, Daejeon (KR); Minehul Jang, Daejeon (KR); Suk Il Youn, Daejeon (KR); Byoungkuk Son, Daejeon (KR); Se Ho Park, Daejeon (KR)

(73) Assignees: LG ENERGY SOLUTION, LTD., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 587 days.

(21) Appl. No.: 16/489,273

(22) PCT Filed: Jun. 22, 2018

(86) PCT No.: PCT/KR2018/007101
§ 371 (c)(1),
(2) Date: Aug. 27, 2019

(87) PCT Pub. No.: WO2019/013467
PCT Pub. Date: Jan. 17, 2019

(65) Prior Publication Data
US 2020/0067069 A1   Feb. 27, 2020

(30) Foreign Application Priority Data
Jul. 13, 2017  (KR) ........................ 10-2017-0088750

(51) Int. Cl.
| *B05D 7/22* | (2006.01) |
| *C23C 4/06* | (2016.01) |
| *C25D 7/04* | (2006.01) |
| *D01F 8/18* | (2006.01) |
| *D01F 9/21* | (2006.01) |
| *D01F 9/22* | (2006.01) |
| *D01D 5/00* | (2006.01) |
| *D01F 9/14* | (2006.01) |
| *H01M 4/04* | (2006.01) |
| *H01M 4/36* | (2006.01) |
| *H01M 4/485* | (2010.01) |
| *H01M 4/587* | (2010.01) |
| *H01M 10/0568* | (2010.01) |
| *H01M 10/0569* | (2010.01) |
| *D02J 13/00* | (2006.01) |
| *D06M 11/83* | (2006.01) |
| *D01F 9/20* | (2006.01) |
| *D01D 5/24* | (2006.01) |
| *H01M 4/1395* | (2010.01) |
| *H01M 4/62* | (2006.01) |
| *C23C 16/04* | (2006.01) |
| *H01M 4/02* | (2006.01) |
| *D06M 101/40* | (2006.01) |

(52) U.S. Cl.
CPC ............. *D01D 5/003* (2013.01); *B05D 7/222* (2013.01); *B05D 7/225* (2013.01); *C23C 16/045* (2013.01); *D01D 5/0038* (2013.01); *D01D 5/24* (2013.01); *D01F 9/14* (2013.01); *D01F 9/20* (2013.01); *D02J 13/00* (2013.01); *D06M 11/83* (2013.01); *H01M 4/0411* (2013.01); *H01M 4/0421* (2013.01); *H01M 4/0452* (2013.01); *H01M 4/0471* (2013.01); *H01M 4/0497* (2013.01); *H01M 4/1395* (2013.01); *H01M 4/362* (2013.01); *H01M 4/485* (2013.01); *H01M 4/587* (2013.01); *H01M 4/62* (2013.01); *H01M 10/0568* (2013.01); *H01M 10/0569* (2013.01); *D06M 2101/40* (2013.01); *D10B 2101/12* (2013.01); *D10B 2101/20* (2013.01); *H01M 2004/021* (2013.01)

(58) Field of Classification Search
CPC .......... B05D 7/22; B05D 7/222; B05D 7/225; C23C 4/06; C23C 16/045; C25D 7/04; D01D 5/0038; D01D 5/0046; D01D 5/24; D01F 8/18; D01F 9/20; D01F 9/21; D01F 9/22; D06M 11/83
USPC .... 264/29.1, 129, 171.26, 171.28, 464, 465, 264/466, 484; 8/115.68; 205/131; 423/447.1; 427/181, 230, 250, 476
See application file for complete search history.

(56) References Cited

U.S. PATENT DOCUMENTS

| 2010/0067640 A1* | 3/2010 | Willis ....................... H05H 3/06 376/194 |
| 2011/0165465 A1 | 7/2011 | Kim et al. |

(Continued)

FOREIGN PATENT DOCUMENTS

| CN | 103682283 A | 3/2014 |
| CN | 109964344 A | 7/2019 |

(Continued)

OTHER PUBLICATIONS

Translation of KR 1373538 B1 (published on Mar. 13, 2014.*

(Continued)

*Primary Examiner* — Leo B Tentoni
(74) *Attorney, Agent, or Firm* — Birch, Stewart, Kolasch & Birch, LLP

(57) ABSTRACT

A method of preparing a structure, more particularly, a method of preparing a structure capable of ensuring a space for carrying an electrode active material by a simple method which includes an electrospinning process using a double nozzle electrospinning device and a heat treatment process.

10 Claims, 6 Drawing Sheets

(56) References Cited

U.S. PATENT DOCUMENTS

2014/0087255 A1   3/2014  Kim et al.
2015/0132642 A1*  5/2015  Joo ..................... H01M 4/604
                                                        264/465 X
2019/0229342 A1   7/2019  Son et al.

FOREIGN PATENT DOCUMENTS

| EP | 2711338 A1 | | 3/2014 | |
|----|------------|---|--------|---|
| JP | 2014-67713 A | | 4/2014 | |
| JP | 2019-530197 A | | 10/2019 | |
| KR | 10-1155909 B1 | | 6/2012 | |
| KR | 10-1373538 B1 | | 3/2014 | |
| KR | 1373538 B1 | * | 3/2014 | .............. D01D 5/00 |
| KR | 10-2014-0039603 A | | 4/2014 | |
| KR | 10-1454865 B1 | | 11/2014 | |
| KR | 10-2015-0024034 A | | 3/2015 | |
| KR | 10-2015-0121786 A | | 10/2015 | |
| KR | 10-1678943 B1 | | 11/2016 | |
| WO | WO 2018/189336 A | | 9/2018 | |

OTHER PUBLICATIONS

Extended European Search Report, dated Jan. 9, 2020, for European Application No. 18831580.8.

Hwang et al., "Electrospun Core-Shell Fibers for Robust Silicon Nanoparticle-Based Lithium Ion Battery Anodes", Nano Letters, 2012, vol. 12, pp. 802-807.

International Search Report for PCT/KR2018/007101 dated Dec. 17, 2018.

Lee et al., "Fabrication of Si core/C shell nanofibers and their electrochemical performances as a lithium-ion battery anode", Journal of Power Sources, 2012, vol. 206, pp. 267-273.

Park et al., "Coaxial Electrospinning of Self-Healing Coatings", Advanced Materials, 2010, vol. 22, pp. 496-499.

Yan et al., "Selective Deposition and Stable Encapsulation of Lithium through Heterogeneous Seeded Growth", Nature Energy, Article No. 16010, Mar. 22, 2016, vol. 1, No. 3, total 8 pages.

* cited by examiner

【Figure 1a】
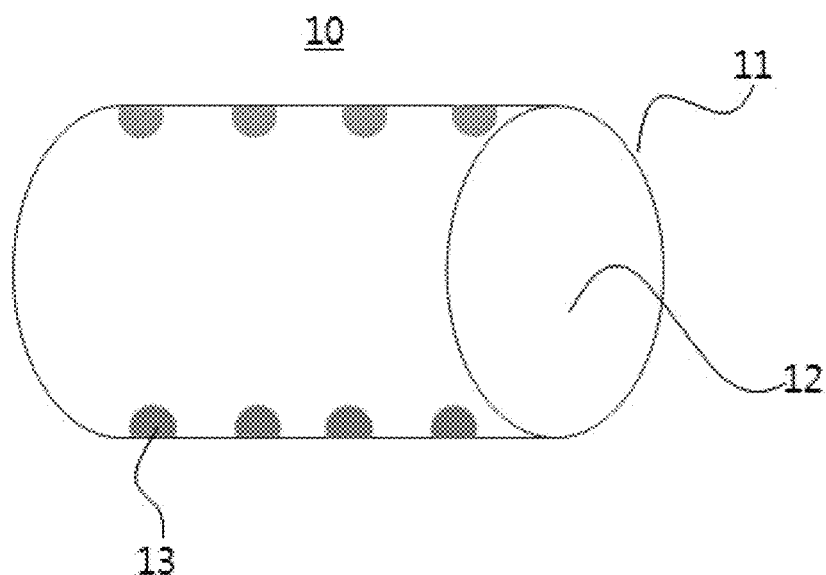
【Figure 1b】
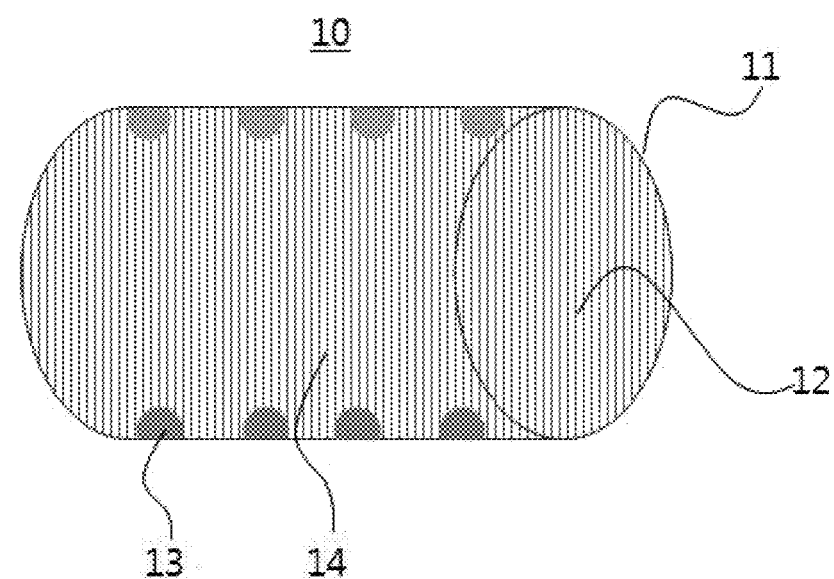

【Figure 2a】
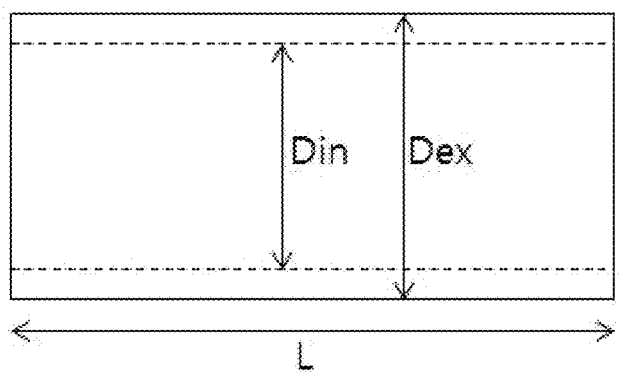
【Figure 2b】
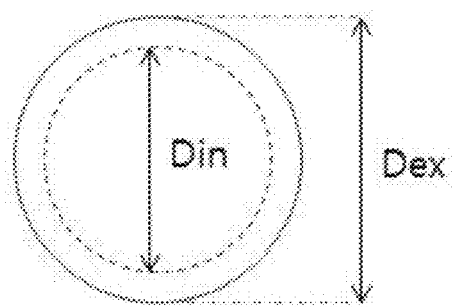
【Figure 3a】
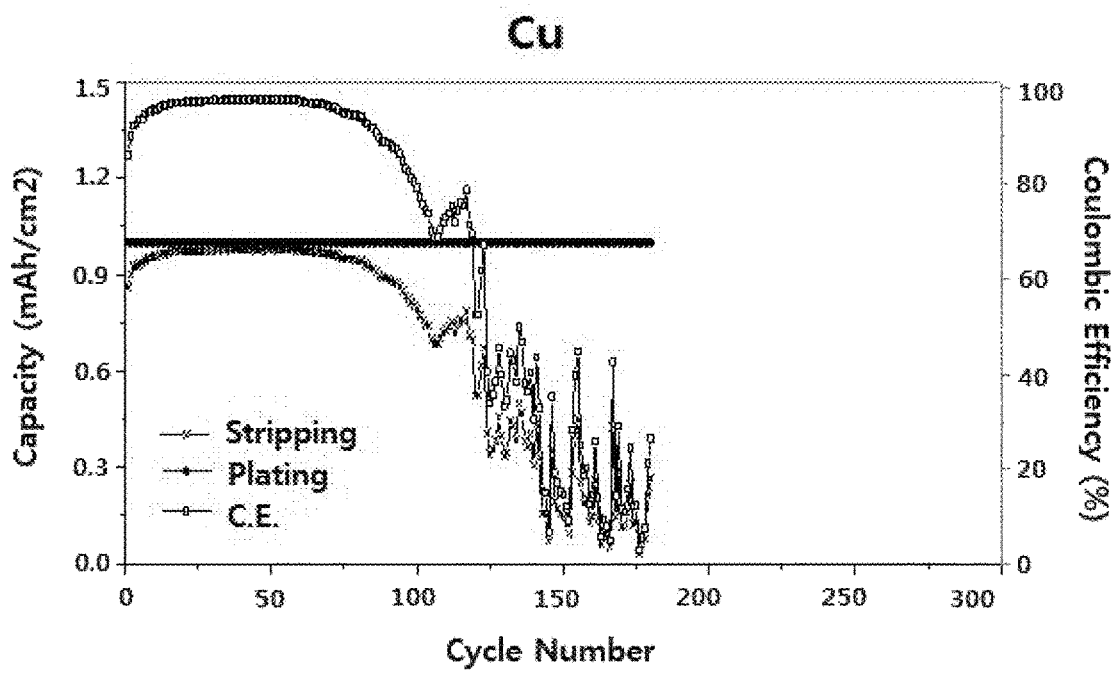

[Figure 3b]
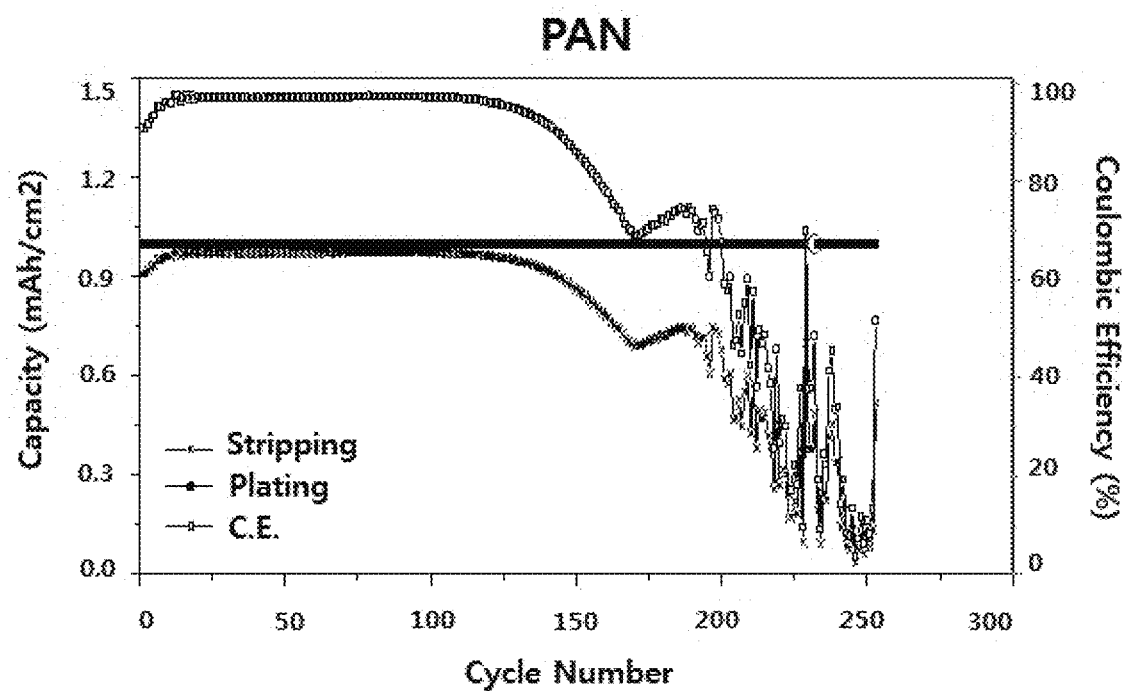

[Figure 3c]
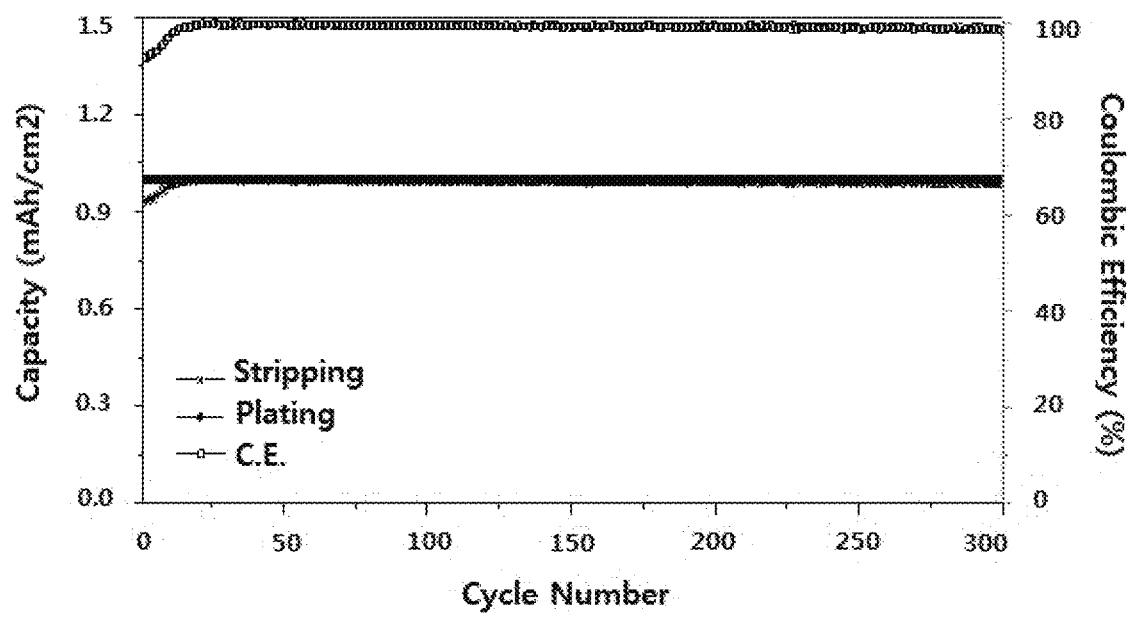

[Figure 4]
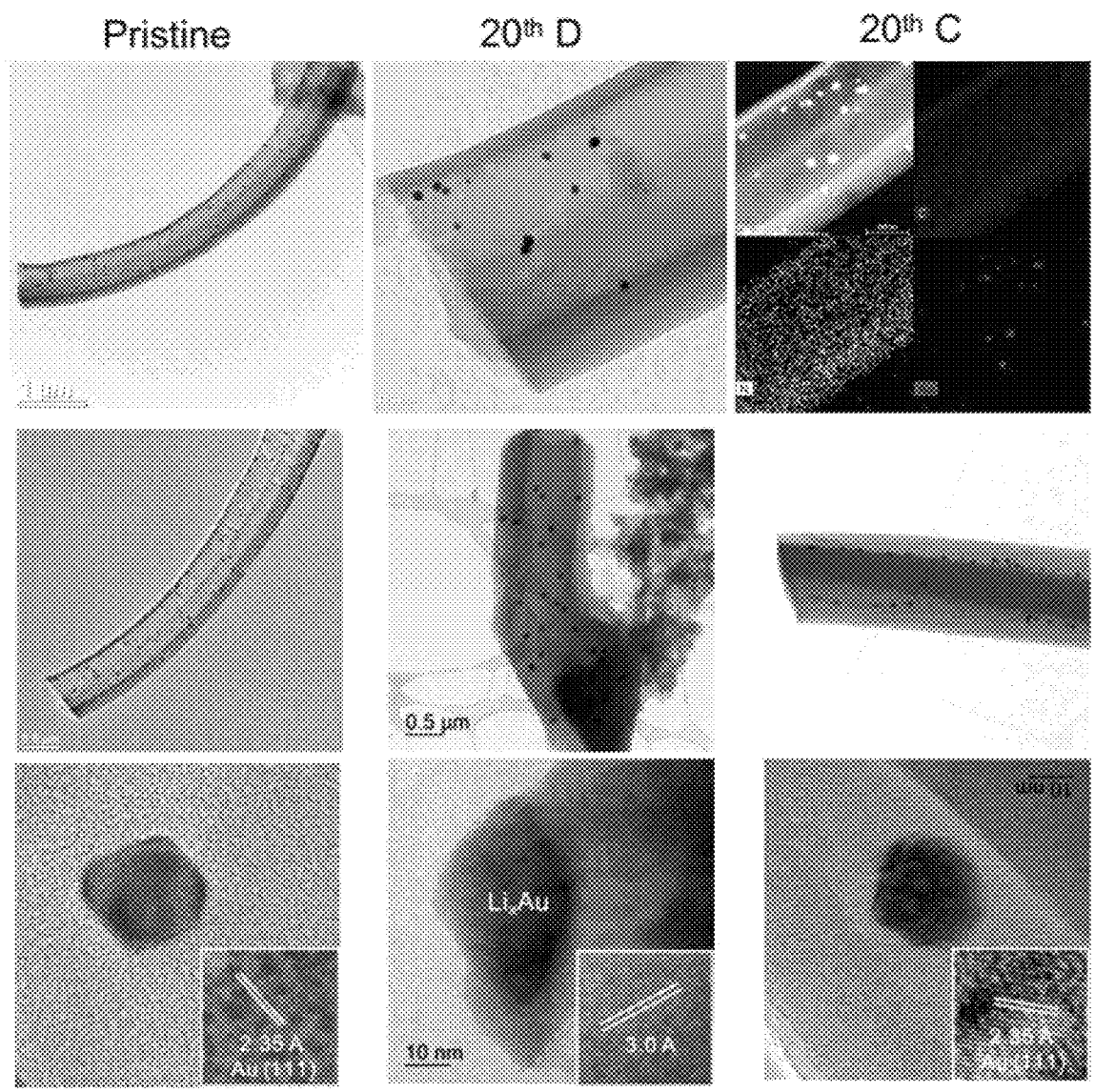

[Figure 5]
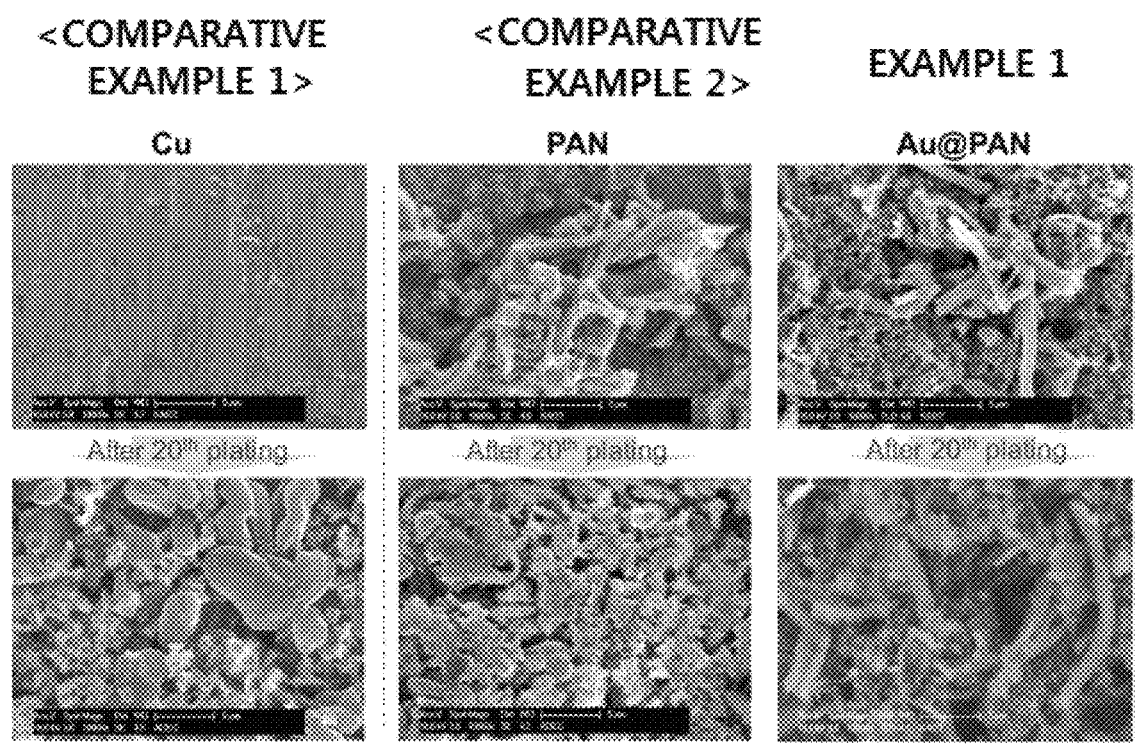

METHOD FOR MANUFACTURING STRUCTURE

TECHNICAL FIELD

This application claims the benefit of priority based on Korean Patent Application No. 10-2017-0088750, filed on Jul. 13, 2017 the entire contents of which are incorporated herein by reference.

The present invention relates to a method of manufacturing a structure that can be used for carrying the electrode active material.

BACKGROUND ART

In recent years, as it has become possible to reduce the size and weight of electronic equipment by the development of the electronic industry, the use of portable electronic devices has been increasing. For power sources for such portable electronic devices, the need for a secondary battery having a high energy density has been increased, and thus research on a lithium secondary battery has been actively conducted. In addition, the lithium ion battery, which is being used as a battery for electric vehicles, is used only in short-distance driving vehicles due to its physical limit (maximum energy density of about 250 Wh/kg).

Lithium metal is an ideal material for the negative electrode of the lithium secondary battery with high energy density since it has high theoretical capacity of 3,862 mAh/g and low standard electrode potential (−3.04 vs SHE). However, lithium metal has not been commercialized as a negative electrode material for the lithium battery due to its safety problem with regard to internal short circuit of the battery by the growth of lithium dendrite. Also, lithium metal can cause a side reaction with the active material or electrolyte, which greatly affect the short-circuit and service life of the battery. Therefore, technology for stabilization of lithium metal electrode and suppression of dendrite is a key technology that must be preceded for the development of the next generation lithium secondary battery.

Various types of electrode active materials have been studied to inhibit the growth of the lithium metal dendrite and to prevent the reaction between the lithium metal and the electrolyte solution.

For example, a negative electrode active material, in which Au is deposited on the inner surface of the hollow capsule and lithium metal is filled in the hollow capsule by Au as a seed, has been developed (Nature Energy 1, Article number: 16010 (2016), "Selective deposition and stable encapsulation of lithium through heterogeneous seeded growth"). The hollow capsule is a hollow capsule prepared by using silica spheres as templates. However, since the silica spheres have to be removed through a separate etching process in the preparation of the hollow capsule, there is a problem that the process cost is increased and the production cost is increased. Also, when the hollow capsule is used as a negative electrode active material, the stability in the electrolyte solution can be ensured due to the closed shape. However, there are problems that it is difficult to control the volume of the lithium metal filled in the hollow capsule and when constructing the electrode, the electrical conductivity may be lowered due to the spherical shape.

Therefore, it is necessary to develop an active material which has a form easy to control the amount of the electrode active material depending on the capacity of battery, while preventing the formation of the dendrite of lithium metal and the reaction between lithium metal and the electrolyte solution.

PRIOR ART LITERATURE

Patent Literature

Korean Patent No. 1155909, "NEGATIVE ACTIVE MATERIAL FOR RECHARGEABLE LITHIUM BATTERY, METHOD OF PREPARING SAME, AND RECHARGEABLE LITHIUM BATTERY INCLUDING SAME."

Non-Patent Literature

Nature Energy 1, Article number: 16010 (2016), "Selective deposition and stable encapsulation of lithium through heterogeneous seeded growth."

DISCLOSURE

Technical Problem

In order to solve the above problems, the present inventors, as a result of various studies, have developed a method of preparing a structure capable of carrying the electrode active material wherein the structure is prepared in the form of tube shape by forming a tube precursor having a core-shell shape using the double nozzle electrospinning device and then heat-treating it. In the case of the structure capable of carrying the electrode active material prepared by such a simple process, it is possible to prevent the electrode active material from growing into a dendrite shape and to prevent the reaction between the electrode active material and the electrolyte solution, thereby improving the stability of the battery.

Therefore, it is an object of the present invention to provide a method of preparing a structure having a shape capable of improving the safety of a battery by carrying an electrode active material.

Technical Solution

In order to achieve the above object, the present invention provides a method of preparing a structure comprising the following steps of, (S1) injecting a metal precursor solution and a carbon-based polymer solution into a double nozzle electrospinning device and electrospinning them to form a tube precursor having a core-shell structure; (S2) a first heat treatment step of heat-treating the tube precursor to carbonize the core of the tube precursor; and (S3) a second heat treatment step of heat-treating the tube precursor treated by the first heat treatment to form a tube structure.

In this case, the metal precursor solution and the carbon-based polymer solution can be injected into an inner nozzle and an outer nozzle of the double nozzle electrospinning device, respectively, for electrospinning.

In addition, the metal precursor solution may contain 0.1 to 5 wt. % of a metal precursor; 1 to 20 wt. % of a polymer; and 75 to 95 wt. % of a solvent.

In addition, the metal precursor may be at least one selected from the group consisting of alkoxide containing metal, acetyl acetate containing metal, nitrate containing metal, oxalate containing metal, halide containing metal and cyanide containing metal.

In addition, the metal may be at least one selected from the group consisting of Au, Zn, Mg, Ag, Al, Pt, Si and Ca.

In addition, the polymer may be at least one selected from the group consisting of polymethyl methacrylate (PMMA), polyvinyl pyrrolidone (PVP), polyvinyl acetate (PVAc), polyvinyl alcohol (PVA), polystyrene (PS) and polyvinylidene fluoride (PVDF).

In addition, the solvent may be at least one selected from the group consisting of NMP (methyl pyrrolidone), DMF (dimethyl formamide), DMAc (dimethylacetamide), DMSO (dimethyl sulfoxide) and THF (tetrahydrofuran).

In addition, the carbon-based polymer may be at least one selected from the group consisting of polyacrylonitrile (PAN), polyaniline (PANI), polypyrrole (PPY), polyimide (PI), polybenzimidazole (PBI), polypyrrolidone (Ppy), polyamide (PA), polyamide-imide (PAI), polyaramide, melamine, melamine formaldehyde and fluorine mica.

In addition, a temperature during the first heat treatment may be 200° C. to 700° C.

In addition, a temperature during the second heat treatment may be more than 700° C. and not more than 1000° C.

In addition, after the step (S3), a step (S4) of forming lithium metal in an interior of the tube structure may be further included.

In addition, the lithium metal may be formed in the interior of the tube structure by electrolytic plating, electroless plating or vapor deposition.

Advantageous Effects

According to the method of preparing a structure according to the present invention, the structure of the tube shape can be prepared by electrospinning, in particular by an electrospinning process using a double nozzle electrospinning device.

In addition, the structure can be manufactured by a simple process by the electrospinning process and the heat treatment, and thus the process cost and the production cost of the structure can be reduced.

In addition, the electrode active material such as lithium metal may be carried in the interior of the structure of the tube shape thus prepared and used as an electrode active material.

Also, due to the metal formed on the inner surface of the tube included in the structure, the electrode active material is around the metal and it is possible to prevent the electrode active material from growing in a dendrite shape around the metal, and also, to prevent the reaction with the electrolyte solution, thereby improving the safety of the battery. Specifically, the structure may be used as a negative electrode active material having lithium metal carried therein.

DESCRIPTION OF DRAWINGS

FIGS. 1a and 1b are schematic views of the structures according to one embodiment of the present invention ((a): structure before carrying lithium metal, (b) structure after carrying lithium metal).

FIGS. 2a and 2b are schematic views showing a longitudinal section (a) and a transverse section (b) of the tube in the structure according to one embodiment of the present invention.

FIGS. 3a to 3c are graphs showing the results of the charging/discharging tests for lithium half-cells manufactured by using structures of Example of the present invention and Comparative Examples.

FIG. 4 is TEM (transmission electron microscopy) photographs showing morphological changes before and after charging/discharging of the lithium half-cell manufactured by using the structure of Example 1 (Pristine: before charging/discharging; $20^{th}$ D: after $20^{th}$ discharging; $20^{th}$ C: after $20^{th}$ charging).

FIG. 5 is SEM (scanning electron microscope) photographs showing the growth patterns of lithium metal at the time of charging of the lithium half-cells manufactured by the structures of Example and Comparative Examples.

BEST MODE

Hereinafter, the present invention will be described in detail in order to facilitate understanding of the present invention.

The terms and words as used in the present specification and claims should not be construed as limited to ordinary or dictionary meanings but should be construed in light of the meanings and concepts consistent with the technical idea of the present invention based on the principle that inventors can properly define the concept of a term to describe their invention in the best way possible.

The term "tube precursor" as used in the present invention is a core-shell material prepared by a dual nozzle electrospinning device wherein the core contains the metal precursor solution and the carbon-based polymer solution, and the shell contains the carbon-based polymer solution.

The term "tube structure" as used in the present invention refers to the structure of a tube shape where the core is empty and metal is formed on the inner surface of the shell by heat-treating the tube precursor to carbonize and remove the polymer in the metal precursor solution contained in the core.

The present invention relates to a method of preparing a structure carrying the electrode active material or capable of carrying the electrode active material wherein the structure is a tube-like structure which has a core-shell shape wherein the core is empty and a metal with good reactivity with the electrode active material is formed on the inner surface of the shell.

Method of Preparing the Structure

The present invention relates to a method of preparing a structure, which comprises the following steps of, (S1) injecting the metal precursor solution and the carbon-based polymer solution into the double nozzle electrospinning device and electrospinning to form a tube precursor having a core-shell shape;

(S2) a first heat treatment step of heat-treating the tube precursor to carbonize the core; and (S3) a second heat treatment step of heat-treating the tube precursor treated by the first heat treatment to form a tube structure; and which may further comprise the following step of, (S4) forming lithium metal in the interior of the tube structure.

Hereinafter, the method of preparing the structure according to the present invention will be described in detail for each step.

Step (S1)

In the step (S1), a tube precursor may be formed by electrospinning the metal precursor solution and carbon-based polymer solution.

The electrospinning may be performed by an electrospinning method using a double nozzle including inner and outer nozzles wherein the method may be performed in the range of tip to collector distance (TCD) of 5 to 20 cm while using a steel-use-stainless (SUS) as a collector, using a high-pressure electrospinning device.

The electrospinning may be carried out using an electrospinning device using a double nozzle which can be used conventionally in the art. The dual-nozzle system (Adv. Mater, 2010, 22, 496) may be used, but is not limited thereto, and the electrospinning device can be used without limitation if it is an electrospinning device with a double nozzle structure including inner and outer nozzles.

The requirements for electrospinning to prepare the structure according to the present invention include the relative humidity, the electrospinning power and the flow rate of the spinning solution.

Specifically, the relative humidity may be 10 to 20%, the electrospinning power may be 14.5 V or less, and the ratio of the flow rate of the spinning solution may be 1.0 to 1.5:2 of flow rate in the inner nozzle (core):flow rate in the outer nozzle (shell).

When deviating the relative humidity, the electrospinning power, and the ratio of flow rate as specified above, it may be difficult to prepare the tube precursor for preparing the structure of the tube shape.

The core-shell type tube precursor may be formed by injecting the metal precursor solution and the carbon-based polymer solution into the inner and outer nozzles, respectively, and electrospinning them.

In this case, the metal precursor solution may comprise 0.1 to 5 wt. % of the metal precursor, 1 to 20 wt. % of the polymer and 75 to 95 wt. % of the solvent.

The metal precursor may be at least one selected from the group consisting of alkoxide, acetyl acetate, nitrate, oxalate, halide and cyanide containing metal, and specifically, the metal may be at least one selected from the group consisting of Au, Zn, Mg, Ag, Al, Pt, Si, and Ca.

In addition, when the metal is Au, the Au precursor may be at least one selected from the group consisting of $HAuCl_4$, $AuC_4.3H_2O$, $HAuCl_4.4H_2O$, $AuCl_3$ and AuCl.

If the metal precursor is less than 0.1 wt. %, it is impossible to form enough metal to act as a seed metal for the growth of lithium metal, so that the lithium metal cannot be filled in the tube as much as desired. If the metal precursor is more than 5 wt. %, since the amount of metal formed is increased on the basis of the total weight of the structure and thus the amount of lithium metal formed in the structure may be relatively decreased, the cycle life characteristics of the battery may be deteriorated. Preferably, the metal precursor can be used in an amount of 0.1 to 4 wt. %, and more preferably 0.1 to 3 wt. %.

In addition, the polymer may be at least one selected from the group consisting of polymethylmethacrylate (PMMA), polyvinyl pyrrolidone (PVP), polyvinyl acetate (PVAc), polyvinyl alcohol (PVA), polystyrene (PS), and polyvinylidene fluoride (PVDF), but normally, polymers that can be removed at the carbonization temperature of carbon-based polymers can be widely used.

If the polymer is less than 1 wt. %, the formation of the tube precursor by electrospinning may be difficult. If the polymer is more than 20 wt. %, the polymer may not be sufficiently removed during the first heat treatment and may be remained, thereby degrading the performance of the battery. Preferably, the polymer may be used in an amount of 3 to 17 wt. %, and more preferably 5 to 15 wt. %.

The solvent may be at least one selected from the group consisting of NMP (methyl pyrrolidone), DMF (dimethylformamide), DMAc (dimethylacetamide), DMSO (dimethyl sulfoxide), THF (tetrahydrofuran) and a mixture thereof.

If the solvent is less than 75 wt. %, it may be difficult to produce a metal precursor solution. If the solvent is more than 95 wt. %, the amount of the metal precursor and the polymer may be relatively reduced and thus it may be difficult to form as many metals as desired in the interior of the structure. Preferably, the solvent may be used in an amount of 70 to 95 wt. %, and more preferably 80 to 90 wt. %.

A carbon-based polymer solution may be prepared by dissolving a carbon-based polymer in a solvent.

The carbon-based polymer may be at least one selected from the group consisting of polyacrylonitrile (PAN), polyaniline (PANT), polypyrrole (PPY), polyimide (PI), polybenzimidazole (PBI), polypyrrolidone (Ppy), polyamide (PA), polyamide-imide (PAI), polyaramide, melamine, melamine-formaldehyde and fluorine mica. Meanwhile, the carbon density of the carbon contained in the tube may be 2.0 to 2.5 $g/cm^2$.

The solvent may be at least one selected from the group consisting of NMP (methylpyrrolidone), DMF (dimethylformamide), DMAc (dimethylacetamide), DMSO (dimethyl sulfoxide), THF (tetrahydrofuran) and a mixture thereof.

The carbon-based polymer solution may be prepared by dissolving 1 to 20 wt. % of the carbon-based polymer in 80 to 99 wt. % of the solvent.

If the amount of the carbon-based polymer is less than wt. %, the weight of the carbon-based polymer is insufficient to form the tubes, and thus the tubes may not be formed after electrospinning. If the amount of the carbon-based polymer is more than 20 wt. %, the electrospinning may not proceed smoothly because the concentration of the carbon-based polymer solution is excessively high.

If the solvent is less than 80 wt. %, the electrospinning may not proceed smoothly because the concentration of the carbon-based polymer solution is excessively high. If the solvent exceeds 99 wt. %, the shape of tube may not be formed after electrospinning.

The solvent may be at least one selected from the group consisting of NMP (methyl pyrrolidone), DMF (dimethylformamide), DMAc (dimethylacetamide), DMSO (dimethyl sulfoxide), THF (tetrahydrofuran) and a mixture thereof.

The solvents used in the preparation of the metal precursor solution and the carbon-based polymer solution may be the same or different.

Step (S2)

In the step (S2), the tube precursor may be heat-treated to carbonize the core, and this step is referred to as a first heat treatment step. In this case, the heating temperature at the time of the first heat treatment may be 200° C. to 700° C., preferably 200° C. to 600° C., more preferably 200° C. to 500° C. The step may be a step of heat-treating while raising the temperature. In the process of raising the temperature during the first heat treatment, the polymer contained in the core of the tube precursor may be removed and the metal precursor may be reduced to form a metal.

If the temperature of the first heat treatment is less than 200° C., the polymer contained in the core of the tube precursor may not be removed and at the same, the metal precursor may not be reduced. Since the removal of the polymer and the reduction of the metal precursor can both be performed at 700° C., if the temperature is higher than 700° C., there is a problem that the metal is formed not only on the inner surface of the tube but also on the outer surface of the tube.

Through this reduction reaction, the metal may be formed on the inner surface of the tube, the metal may be in the form of particles, and the size of the particles may be in the nano-size of 1 to 50 nm.

Meanwhile, the first heat treatment may be performed under an inert atmosphere. Specifically, the inert atmosphere may be formed by at least one inert gas selected from the group consisting of Ar, $N_2$, He, Ne and Ne.

Step (S3)

In step (S3), the tube precursor treated by the first heat treatment may be heated by the second heat treatment to carbonize the shell of the tube precursor and thus form a tube containing carbon.

At this time, the heating temperature during the second heat treatment may be more than 700° C. and not more than 1000° C., preferably 750° C. to 950° C., more preferably 800° C. to 900° C. If the temperature of the second heat treatment is 700° C. or less, the carbonization may not be completely performed. If the temperature is more than 1000° C., the physical properties of the formed tube may be deteriorated due to the high temperature heat treatment.

Step (S4)

In step S4, lithium metal may be formed in the interior of the tube.

The method of forming the lithium metal in the interior of the tube may be one of a method selected from the group consisting of electrolytic plating, electroless plating and vapor deposition, but is not limited thereto, and it is possible to use a wide range of methods to fill the interior of the tube by forming lithium metal in the interior of the tube.

The lithium source for forming the lithium metal may be, but is not limited to, at least one selected from the group consisting of a lithium salt, a lithium ingot, and a lithium metal oxide, but any lithium source can be used as long as it is a compound that can provide lithium ions.

The lithium salt may be at least one selected from the group consisting of $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)$ $LiN(C_2F_5SO_2)_2$, $LiN(CF_3SO_2)_2$, $LiN(CaF_{2a+1}SO_2)$ $(CbF_{2b+1}SO_2)$ (wherein a and b are natural numbers, and preferably $1 \leq a \leq 20$ and $1 \leq b \leq 20$), LiCl, LiI and $LiB(C_2O_4)_2$.

The lithium metal oxide may be at least one selected from the group consisting of $LiMO_2$ (M=Co, Ni, Mn), $Li_{1+x}Mn_{2-x}O_4^+$ ($0 \leq x \leq 0.3$) and $LiNi_{1-x}M_xO_2$ (M=Co, Mn, Al, Cu, Fe, Mg, B or Ga, and $0.01 \leq x \leq 0.3$). For example, the lithium metal oxide may be $LiCoO_2$, $LiNiO_2$, $LiMn_2O_4$, $Li(Ni_aMn_b\text{-}Co_c)O_2$ (a+b+c=1), $LiNi_{0.5}Mn_{1.5}O_4$ or $LiNi_{0.5}Mn_{0.5}O_2$.

The lithium metal carrying structure prepared by the above method may be applied as a negative electrode active material of a lithium metal battery to solve the problems of formation of lithium metal dendrite and thus interface instability which are troublesome problems of the conventional lithium metal battery.

In the method of preparing the structure as described above, the structure prepared by steps (S1) to (S3) is a structure, in which the interior is empty and the metal is formed on the inner surface of the tube, and the structure prepared by steps (S1) to (S4) is a structure in which the interior is filled with lithium metal and the metal is formed on the inner surface of the tube.

The structure prepared by the above steps (S1) to (S3) is referred to as structure (1), and the structure prepared by the above steps (S1) to (S4) is referred to as structure (2). Hereinafter, these structures will be described in detail.

Structure (1)

The present invention relates to a structure capable of carrying an electrode active material, wherein when the structure carries lithium metal as a negative electrode active material, it can prevent the lithium metal from growing in the dendrite form at the negative electrode of the lithium metal battery, and at the same time, prevent the lithium metal from reacting directly with the electrolyte solution.

Hereinafter, the present invention will be described in more detail with reference to the drawings.

FIGS. 1a and 1b are schematic views of structures according to one embodiment of the present invention.

Referring to FIG. 1a, the structure 10 may comprise a cylindrical tube 11 with both sides open; and a metal 13 formed on the inner surface of the tube 11.

FIGS. 2a and 2b are schematic views showing longitudinal and transverse sections of a tube in a structure according to one embodiment of the present invention, respectively.

Referring to FIGS. 2a and 2b, the aspect ratio (a) of the longitudinal section of the tube 11 may be more than 1.

At this time, the aspect ratio of the longitudinal section of the tube 11 can be calculated by the following equation 1.

$$a = L/D_{ex} \qquad \text{[Equation 1]}$$

wherein L is the length of the tube 11, and $D_{ex}$ is the outer diameter of the tube 11.

Since the structure 10 has a shape of the tube 11 having an aspect ratio of more than 1 (a>1) and also, the tube 11 includes the carbon-based polymer as described above, and thus the structure 10 itself can function as an electrical conduction path In addition, the tube 11 has a cylindrical shape with both sides open, and may itself be an electric conduction path, and the ion conductivity can be improved by wetting by the electrolyte solution.

The shell of the tube 11 can exhibit electrical conductivity and exhibit lithium ion conductivity together.

At this time, the shell of the tube 11 may contain carbon, and the carbon may be amorphous carbon.

Meanwhile, the metal 13 may be included in the shape formed on the inner surface of the tube 11, and the metal 13 may be included in an amount of 0.1 to 25 wt. % based on the total weight of the structure 10, that is, the tube 11 and the metal 13.

If the weight of the metal 13 is less than 0.1 wt. %, the site to which the electrode active material 14 can be bonded may not be sufficient. If the weight of the metal 13 is more than 25 wt. %, since the amount that can be filled by the electrode active material 14 is relatively reduced due to the excessive amount of metal 13, the specific capacity of the electrode active material 14 may be reduced.

The metal 13 may be formed in the form of particles on the inner surface of the tube 11, and the particle diameter of the metal 13 may be 1 to 50 nm. If the diameter of the metal 13 is less than 1 nm, the area to which the electrode active material 14 is bonded is insufficient to induce smooth growth of the electrode active material 14. If the particle diameter is more than 50 nm, the area in which the metal 13 is formed becomes larger and thus the specific capacity of the electrode active material 14 may be decreased.

In the present invention, the tube 11 may be one for carrying the electrode active material 14.

The electrode active material 14 may be a positive electrode active material or a negative electrode active material commonly used.

The positive electrode active material may be an oxide composed of lithium and transition metal having a structure capable of intercalating lithium, and for example, may be represented by the following Formula 1:

$$Li_aNi_{1-x-y}Co_xMn_yM_bO_2 \qquad \text{[Formula 1]}$$

wherein a=1, $0.1 \leq x \leq 0.3$, $0.15 \leq y \leq 0.25$, and $0 \leq b \leq 0.05$, and M may be any one selected from transition metal or lanthanide elements selected from the group consisting of Al, Cr, Mn, Fe, Mg, La, Ce, Sr, V, Zn and a combination thereof.

Representative examples of the negative electrode active material may be amorphous carbons such as graphite-based carbon and hard carbon, crystalline carbon and the like, and the other metal composite oxide such as $Li_xFe_2O_3$ ($0 \leq x \leq 1$), $LixWO_2$ ($0 \leq x \leq 1$), and $Sn_xMe_{1-x}Me'_yO_z$ (Me: Mn, Fe, Pb, Ge; Me': Al, B, P, Si, group 1, group 2, and group 3 elements of the periodic table, halogen; $0 < x \leq 1$; $1 \leq y \leq 3$; $1 \leq z \leq 8$); lithium metal; lithium alloy; silicon-based alloy; tin-based alloy; metal oxide such as SnO, $Sno_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, and $Bi_2O_5$; conductive polymer such as polyacetylene; Li—Co—Ni-based material and the like can be used, but is not limited thereto. The negative electrode active material can be used without limitation as long as it is a negative electrode active material normally used. The metal 13 may be a metal with a small overvoltage with the electrode active material compared to the electrode current collector; or a metal that forms a multiphase with the electrode active material.

For example, when the electrode active material 14 is lithium metal, the metal with a lower overvoltage than that of Cu (a current collector) at the time of formation of lithium metal is a metal having a lower interfacial energy when it reacts with lithium metal, which can be at least one selected from the group consisting of Au, Zn, Mg, Ag, Al, Pt and Si, and the metal forming the multiphase with the lithium metal is a metal having a plurality of sites capable of reacting with lithium metal, which can be Ca.

An alloy with the electrode active material 14 may be formed on the surface of the metal 13.

For example, if the metal 13 is Au and the electrode active material 14 is lithium metal, an alloy in the form of $Li_xAu$ can be formed between Au and lithium metal, wherein x is a real number satisfying $0 < x \leq 3.75$.

Structure (2)

The present invention also relates to a structure capable of supporting an electrode active material to improve the safety of the battery, wherein, when the structure carries lithium metal as a negative electrode active material, it can prevent the lithium metal from growing in the dendrite form at the negative electrode of the lithium metal battery, and at the same time, prevent the lithium metal from reacting directly with the electrolyte solution The present invention relates to a structure 10 comprising a tube 11 with both sides open; metal 13 included in the inner surface of the tube 11; and lithium metal formed on the metal 13 (FIG. 1b).

A detailed description of the aspect ratio of the tube, the physical properties of the tube showing the electrical conductivity and lithium ionic conductivity, the material of the shell and core, the composition and the metal is the same as that described above.

An alloy of the metal 13 and lithium metal may be formed between the metal 13 and lithium metal, and the alloy may be $Li_xAu$, wherein x may be a real number satisfying $1 \leq x \leq 3.75$.

Meanwhile, as described above, the hollow 12 inside the tube 11 containing the metal 13 may be filled with lithium metal.

The lithium metal may fill the interior of the hollow 12 while growing in combination with the metal 13, and the volume of the lithium metal filled in the interior of the hollow 12 can be calculated by the following Equation 2 which is the volume ratio ($\alpha$) of lithium metal to the free volume of the tube 11, wherein $0 < \alpha \leq 1$.

$$\alpha = V_{Li}/V_F \quad \text{[Equation 2]}$$

wherein $V_F$ (cm$^2$) is the free volume of the tube, $V_{Li}$ (cm$^2$) is the volume of lithium metal, $V_F$ is calculated by the following Equation 3:

$$V_F = \pi (D_{in}/2)^2 L \quad \text{[Equation 3]}$$

wherein $D_{in}$ (cm) is the inner diameter of the tube, and L (cm) is the length of the tube.

Within the range of $0 < \alpha \leq 1$, as the value of $\alpha$ increases, the volume of the lithium metal contained in the structure (10) increases, so that the cycle life of the battery can be improved.

Hereinafter, preferred examples will be provided to facilitate understanding of the present invention, but it will be apparent to those skilled in the art that various modifications and variations can be made in the present invention without departing from the spirit or scope of the inventions, and such modifications and variations are intended to fall within the scope of the appended claims.

Example 1: Preparation of Structure 1-1. Formation of Tube Precursor by Electrospinning A metal precursor solution was prepared by dissolving 0.5 wt. % of $HAuCl_4$ as a metal precursor and 11 wt. % of PMMA as a polymer in 88.5 wt. % of a solvent. At this time, a solvent mixture of dimethylformamide (DMF) and acetone in a weight ratio of 85 wt. %:15 wt. % was used as a solvent.

A carbon-based polymer solution was prepared by dissolving PAN 13 wt. % as a carbon-based polymer in 87 wt. % of dimethylformamide (DMF) as a solvent.

A tube type structure was formed by injecting the metal precursor solution and the carbon-based polymer solution to the inner nozzle and the outer nozzle of the dual-nozzle system (Adv. Mater., 2010, 22, 496) including the inner nozzle and the outer nozzle, respectively, and electrospinning them.

Conditions for electrospinning were set as follows.

Relative humidity: 15%

Electrospinning power: 14.5 kV

Output of spinning solution (flow rate): Core=0.9 mL/h (1.3/2 ratio) and Shell=1.4 Ml/h 1-2. First Heat Treatment and Reduction of Tube Precursor Au particles were formed on the inner surface of the tube precursor shell by first heat-treating the tube in the furnace at 280° C. to remove PMMA contained in the core of the tube precursor, and reducing $HAuCl_4$ while raising the temperature.

1-3. Second Heat Treatment and Carbonization

Thereafter, the PAN precursor of the tube precursor was carbonized at 850° C. to prepare a structure.

Example 2: Preparation of Lithium Metal Formed Structure

Lithium metal was formed in the interior of the tube having Au formed on the inner surface, which was prepared in Example 1, by electrolytic plating. At this time, lithium salt $LiClO_4$ was used as a lithium source.

At this time, the electrolytic plating was performed by flowing a current at a current density of 1 mA/cm$^2$ to a lithium half-cell manufactured by the following method.

Manufacture of Negative Electrode

The structure prepared in Example 1, Super-P carbon as a conductive material and PVdF as a binder were mixed at a weight ratio of 95:2.5:2.5, and then coated on the Cu current collector and dried to prepare a negative electrode.

Electrolyte Solution

An electrolyte solution prepared by dissolving 1 M LiTFSI (lithium bis-trifluoromethanesulfonimide) in a mixed solvent of DME (1,2-dimethoxyethane) and DOL (1,3-dioxolane) and 1% LiNO$_3$ electrolyte solution were mixed and the mixture was used as an electrolyte solution.

Separator

The separator was a polyethylene separator.

A lithium half-cell was manufactured using the negative electrode, polyethylene separator, and electrolyte solution, as prepared above.

Comparative Example 1

Bare Cu foil was prepared.

Comparative Example 2

Using the same method as in Example 1, a tube shape structure containing no metal was prepared on the inner surface of the tube.

Comparative Example 3

With reference to the contents disclosed in [Nature Energy, 1(3), 16010(2016)], spheres having Au particles formed on its inner surface were prepared by the following steps (a) to (e).

(a) Preparation of Silica Sphere Functionalized with Amino Group 8 ml of NH$_3$H$_2$O (EMD Millipore) was added while hydrolyzing and stirring tetraethyl orthosilicate (TEOS. Aldrich) in a mixture of 80 ml of isopropanol alcohol (IPA, Fisher Scientific) and 12 ml of water. TEOS was decomposed into silica sphere by reacting at room temperature for 2 hours After three centrifugations and washing with IPA/water/ water, all the particles were dispersed in 100 ml of IPA by ultrasonication and then stirred at 60° C.

(b) Preparation of Gold Nanoparticle 1 ml of sodium citrate solution (Alfa, 10%) was diluted in 100 ml of water and heated, and then HAuCl$_4$ (Aldrich, 0.5 M) was injected. The reaction was continued for 5 minutes and then cooled to room temperature to obtain gold nanoparticles.

The average diameter of the prepared gold nanoparticles was 20 nm or less.

(c) Adsorption of Gold Nanoparticles on Silica Sphere

A colloid dispersion of the gold nanoparticles was added to the silica dispersion and the silica spheres were allowed to change from white to pink and finally to purple, and then the silica spheres were separated by centrifugation.

(d) Coating of Spheres with Amorphous Carbon

For the coating of formaldehyde resin, the silica spheres were dispersed in 240 ml of water using ultrasound and then 8 ml of CTAB (Cetyl Trimethyelmonium Bromide, 10 mM) and 0.8 ml of NH3H2O were added and stirred for 10 minutes and allowed the surface charges of the silica spheres to be completely replaced by CTABs. Thereafter, 300 mg of resorcinol (Aldrich) and a formaldehyde solution (Aldrich, 37% aqueous solution) were added and stirred for 8 hours. The thickness of the resin coating can be easily controlled by simultaneously changing the amounts of resorcinol and formaldehyde After three centrifugation and washing, the silica spheres were collected and calcined.

(e) Removal of Silica Template

In order to form a space where lithium metal can be stored, the silica templates were removed by etching using KOH (JK Baker, 5M).

Manufacturing Example: Manufacture of Lithium Half-Cell

Manufacture of Negative Electrode

The structures prepared in Example 1 and Comparative Example 2, respectively, Super-P carbon as a conductive material and PVdF as a binder were mixed at a weight ratio of 95:2.5:2.5, and then coated on a Cu current collector and dried to prepare negative electrodes.

Electrolyte Solution

The electrolyte solution prepared by dissolving 1 M LiTFSI (lithium bis-trifluoromethanesulfonimide) in a mixed solvent of DME (1,2-dimethoxyethane) and DOL (1,3-dioxolane) (volume ratio of 1:1) and 1% LiNO$_3$ electrolyte solution were mixed and the mixture was used as an electrolyte solution.

Separator

The separator was a polyethylene separator.

A lithium half-cell was manufactured using the negative electrode, polyethylene separator, and electrolyte solution as prepared above.

Experimental Example 1: Experiment of Charging/Discharging Characteristics

A charging/discharging test was performed on the lithium half-cells manufactured using the structures manufactured in Example 1 and Comparative Example 2 and on the Cu current collector of Comparative Example 1, respectively, in the Examples.

FIGS. 3a to 3c are graphs showing charging/discharging test results for lithium half-cells manufactured by using the structures of Example and Comparative Examples of the present invention.

Referring to FIGS. 3a to 3c, it can be seen that the lithium half-cell manufactured by using the structure prepared in Example 1 does not exhibit a decrease in capacity until 300 cycles.

Experimental Example 2: Observation of Morphological Change of Structure Depending on Charging/Discharging The morphological changes of the tube-type structure of Example 1 were observed before the experiment of charging/discharging characteristics in the lithium half-cells of Experimental Example 1 (Pristine) and at the time of charging/discharging.

FIG. 4 is TEM (transmission electron microscopy) photographs showing morphological changes before and after charging/discharging of the lithium half-cell manufactured by using the structure of Example 1 (Pristine: before charging/discharging; $20^{th}$ D: after $20^{th}$ discharging; $20^{th}$ C: after $20^{th}$ charging).

Referring to FIG. 4, it can be seen that before the charging/discharging, Au of 15-20 nm in particle diameter is evenly distributed on the inner surface of the tube-type structure. Also, it can be seen that at the time of charging/ discharging, first, the lithium metal bonds with Au in the interior of the tube to form an alloy in the form of Li$_x$Au and particularly, that after $20^{th}$ charging/discharging, lithium metal is formed only in the tube and then escapes.

Experimental Example 3: Observation of Growth Pattern of Lithium Metal

After $20^{th}$ charging in the experiment of charging/discharging characteristics of Experimental Example 1, the growth patterns of lithium metal were observed.

FIG. 5 is SEM (scanning electron microscope) photographs showing the growth patterns of lithium metal at the time of charging of the lithium half-cells manufactured by the structures of Example and Comparative Examples.

Referring to FIG. 5, it can be seen that in the case of the lithium half-cell manufactured by using the structure prepared in Example 1, the formation of lithium metal dendrite after 20th charging is reduced compared to Comparative Example.

As described above, although the invention has been described by limited Examples and drawings, the present invention is not limited thereto and it will be understood that various changes and modifications may be made within the technical idea of the present invention and the scope of equivalents of the claims as set forth below by those of ordinary skill in the art to which the present invention pertains

DESCRIPTION OF SYMBOLS

10: Structure
11: Tube
$D_{ex}$: Outer diameter of the tube
$D_{in}$: Inner diameter of the tube
12: Hollow
13: Metal
14: Electrode active material

The invention claimed is:

1. A method for preparing a structure, comprising the following steps of:
   (S1) injecting a metal precursor solution and a carbon-based polymer solution into a double nozzle electrospinning device and electrospinning them to form a tube precursor having a core-shell structure,
   wherein the metal precursor is at least one selected from the group consisting of alkoxide containing metal, acetyl acetate containing metal, nitrate containing metal, oxalate containing metal, halide containing metal and cyanide containing metal, and the metal is at least one selected from the group consisting of Au, Mg, Ag, Si and Ca;
   (S2) a first heat treatment step of heat-treating the tube precursor to carbonize the core of the tube precursor; and
   (S3) a second heat treatment step of heat-treating the tube precursor treated by the first heat treatment to form a tube structure.

2. The method for preparing the structure according to claim 1, wherein the metal precursor solution and the carbon-based polymer solution are injected into an inner nozzle and an outer nozzle of the double nozzle electrospinning device, respectively, for electrospinning.

3. The method for preparing the structure according to claim 1, wherein the metal precursor solution comprises 0.1 to 5 wt. % of a metal precursor; 1 to 20 wt. % of a polymer; and 75 to 95 wt. % of a solvent.

4. The method for preparing the structure according to claim 3, wherein the polymer is at least one selected from the group consisting of polymethylmethacrylate (PMMA), polyvinyl pyrrolidone (PVP), polyvinyl acetate (PVAc), polyvinyl alcohol (PVA), polystyrene (PS) and polyvinylidene fluoride (PVDF).

5. The method for preparing the structure according to claim 3, wherein the solvent is at least one selected from the group consisting of NMP (methyl pyrrolidone), DMF (dimethylformamide), DMAc (dimethylacetamide), DMSO (dimethyl sulfoxide) and THF (tetrahydrofuran).

6. The method for preparing the structure according to claim 1, wherein the carbon-based polymer is at least one selected from the group consisting of polyacrylonitrile (PAN), polyaniline (PANT), polypyrrole (PPY), polyimide (PI), polybenzimidazole (PBI), polypyrrolidone (Ppy), polyamide (PA), polyamide-imide (PAI), polyaramide, melamine, melamine formaldehyde and fluorine mica.

7. The method for preparing the structure according to claim 1, wherein a temperature during the first heat treatment is 200 to 700° C.

8. The method for preparing the structure according to claim 1, wherein a temperature during the second heat treatment is higher than 700° C. and not more than 1000° C.

9. The method for preparing the structure according to claim 1, further comprising, after step (S3), a step (S4) of forming lithium metal in an interior of the tube structure.

10. The method for preparing the structure according to claim 9, wherein the lithium metal is formed in the interior of the tube structure by electrolytic plating, electroless plating or vapor deposition.

* * * * *